United States Patent
Weinstein

(10) Patent No.: US 6,768,430 B1
(45) Date of Patent: Jul. 27, 2004

(54) SYSTEM AND METHOD FOR ESTABLISHING A SUBSAMPLING RATE FOR REPETITIVE SIGNALS

(75) Inventor: Michael J. Weinstein, Los Altos, CA (US)

(73) Assignee: Agilent Technologies, Inc., Plao Alto, CA (US)

( * ) Notice: Subject to any disclaimer, the term of this patent is extended or adjusted under 35 U.S.C. 154(b) by 0 days.

(21) Appl. No.: 10/392,261

(22) Filed: Mar. 19, 2003

(51) Int. Cl.[7] .............................................. H03M 7/00
(52) U.S. Cl. ....................................... 341/61; 345/134
(58) Field of Search .......................... 341/61, 122, 143, 341/155, 118, 120, 126; 345/440.1, 443, 690

(56) References Cited

U.S. PATENT DOCUMENTS 4,802,098 A * 1/1989 Hansen et al. ................ 702/67
5,115,404 A * 5/1992 Lo et al. ...................... 345/443
6,121,799 A * 9/2000 Moser .......................... 327/58
6,278,435 B1 * 8/2001 Etheridge et al. ......... 345/440.1
6,567,027 B2 * 5/2003 May ............................ 341/155
6,590,512 B2 * 7/2003 Roh et al. ................... 341/143

* cited by examiner

Primary Examiner—Michael Tokar
Assistant Examiner—Linh Van Nguyen

(57) ABSTRACT

The present invention is directed to a system and method which expands the applicability of subsampling to a larger range of signal repetition rates while reducing the range over which the sample rate must be tuned to accommodate a given signal. The resulting sample sequences are in the correct order, enabling direct display with an ordinary oscilloscope or other instrumentation. In one embodiment, a technique is used such that decimation of the samples also improves the response characteristics of the sensor. The system and method provides for a number of different procedures for sampling a signal of a given length. All other parameters being the same, the system allows more freedom in selecting the sample rate to correctly sub-sample a repetitive signal.

20 Claims, 2 Drawing Sheets

SYSTEM AND METHOD FOR ESTABLISHING A SUBSAMPLING RATE FOR REPETITIVE SIGNALS

TECHNICAL FIELD

This invention relates to signal sampling and more particularly to a system and method for adjusting the sampling rate for repetitive signals.

BACKGROUND

A long-running trend in communication and other systems is the use of higher and higher signal frequencies. As signal frequency is increased, the difficulty of characterizing a signal by measuring its time history also increases, to the point that direct acquisition is impractical. However, if the signal of interest is repetitive, its time history can be established by a process known as subsampling, wherein the signal is sampled at a rate that is below the Nyquist sampling frequency for the signal.

For subsampling, the sample rate is chosen such that each successive sample follows the previous sample by some number of signal repetitions plus some time increment. If the time increment is small compared with the period of signal repetition, then the sequence of samples will be a fine-grained time history of the signal, where the equivalent time resolution is equal to the selected time increment. For a repetitive signal, the sequence of samples is identical to that which would be obtained by sampling the signal at a time interval equal to the equivalent time resolution. The sample sequence can be displayed in real-time with a conventional oscilloscope.

Subsampling at a fixed sample rate is only applicable to particular signal repetition rates. Other repetition rates require changes to the sample frequency, and/or the ability to store and reorder the samples.

Digital communications systems, among others, typically utilize binary data streams with fixed data rates. However, it is often desirable to employ test signals of various pattern lengths and therefore various signal repetition rates. But physical limitations of sampling hardware typically constrain the sample rate to a narrow range. If the sample rate cannot be arbitrarily specified, it is not possible to subsample signals of any given repetition rate and thus the range of test signals is limited.

When the required sample rate cannot be realized, the elapsed time between samples will not equal some number of signal repetitions plus some small time increment. Instead, the elapsed time between samples may be equal to some number of signal repetitions plus a significant fraction of the repetition time. Consequently, the samples do not directly represent a time history, but can be reordered to form an equivalent time history. The requirement for data reordering is a severe limitation, because a conventional oscilloscope cannot directly display the samples. Instead the samples must be stored and then reordered according to the relationship between repetition and sample rates, before the display of the samples can take place.

BRIEF SUMMARY

The present invention is directed to a system and method which expands the applicability of subsampling to a larger range of signal repetition rates while reducing the range over which the sample rate must be tuned to accommodate a given signal. The resulting sample sequences are in the correct order, enabling direct display with an ordinary oscilloscope or other instrumentation.

In one embodiment, a technique is used such that decimation of the samples also improves the response characteristics of the sensor. The system and method provides for a number of different procedures for sampling a signal of a given length. All other parameters being the same, the system allows more freedom in selecting the sample rate to correctly subsample a repetitive signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
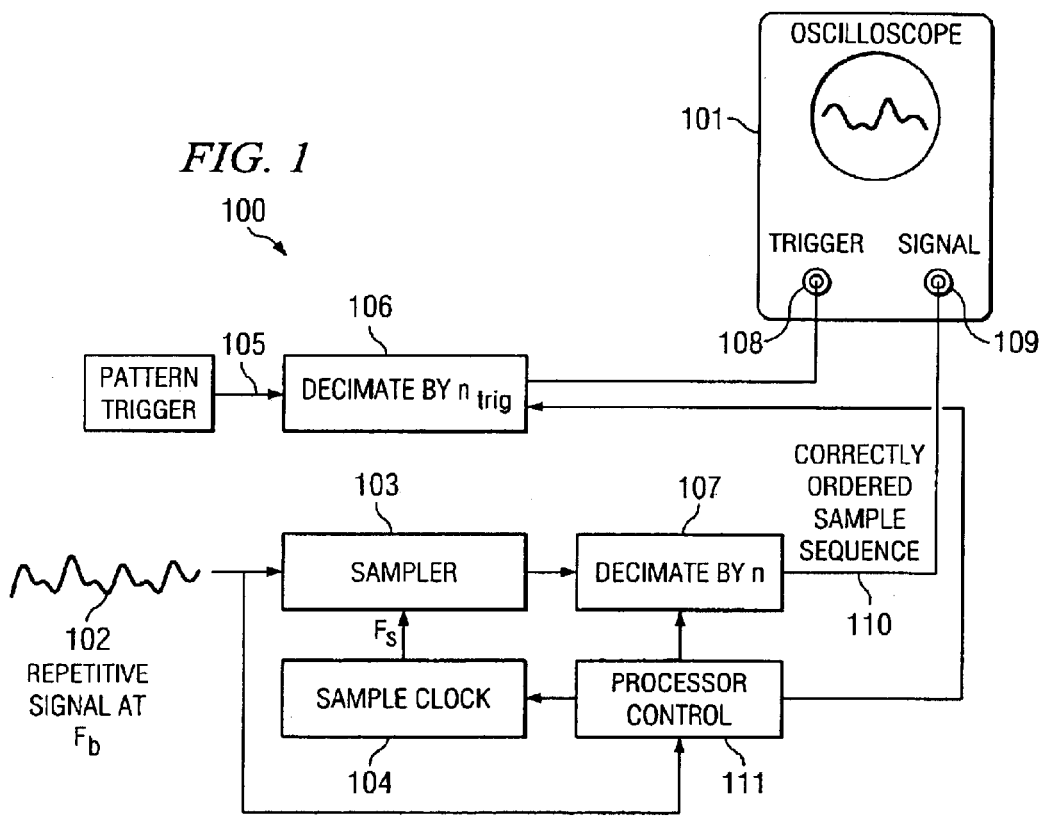
FIG. 1 shows one embodiment where the signal which is to be sampled is (optionally) decimated by a factor n.

FIG. 1 shows a conceptual diagram of one embodiment where repetitive signal 102 to be examined is input to sampler 103 operating at rate $F_s$ established by sample clock 104. The output of sampler 103 is the raw data sequence that, unless modified, would have to be reordered before it can be displayed on instrument 101. Using the concepts of the invention, the raw data sequence is decimated by circuit 107 by factor n, resulting in a correctly ordered sample sequence that can be directly displayed on an ordinary oscilloscope, such as oscilloscope 101. The decimation factor n is uniquely determined as a function of the signal repetition rate and the sample rate.

Optionally, the trigger signal as supplied to terminal 108, can be obtained by decimating the signal from pattern trigger 105 by decimating circuit 106. The pattern trigger may be provided by the signal source or may be derived from the signal itself. The trigger decimation ratio m is also uniquely determined as a function of the signal repetition rate and the sample rate.

The system and method can be performed, for example, in processor control 111, and begins by adjusting $F_s$ such that;

$$n/F_s = m\ N/F_b + \Delta$$

where n and m are positive integers,

N=pattern length (bits)

$F_s$=sample frequency (Hz)

$F_b$=data rate (Hz)
$\Delta$=equivalent time resolution (sec)
n=decimation factor
m=pattern repetitions between decimated samples N is always known: it is the number of bits in the repetitive signal pattern being measured. When $F_s$ has been adjusted, then the sample sequence is decimated by the factor n to produce a temporally correct rendition of the repetitive signal.

To sample a repetitive pattern, choose the sample frequency $F_s$ and decimation ratio parameters m and n so that after some number of samples n, the equivalent sample point has advanced by exactly $\Delta$ seconds. Decimation of the raw sample sequence by a factor n will then result in a temporally correct sample sequence, where 1/$F_s$=time elapsed between samples (sec)
N/$F_b$=pattern repetition time (see)

Constrain the time elapsed during n samples, n/$F_s$, to be equal to the time elapsed during m repetitions of the pattern, plus $\Delta$ seconds:

n/$F_s$=time elapsed over n samples
mN/$F_b$+$\Delta$=time elapsed during m repetitions of the pattern, +$\Delta$ seconds The constraint then, is that n/$F_s$=mN/$F_b$+$\Delta$
Rearranging, $$F_s = n F_b/(mN + \Delta F_b) \qquad (1)$$

The product $\Delta F_b$ is the equivalent resolution measured in bits. What this means is that if, for example, the equivalent resolution in bits were 0.1 or $\frac{1}{10}^{th}$, then when the sample sequence is completed there would be 10 samples per bit in the repetitive signal. Effectively the system and method is able to resolve the qualities of that signal by a granularity represented by a tenth of a bit. This is the meaning of the equivalent resolution measured in bits.

The operational constraints of the measurement system may limit the applicability of measurement by subsampling. Specifically, the sample rate $F_s$ is typically tunable only over a relatively narrow range of frequencies. It is therefore advantageous to choose the decimation parameters m and n such that the frequency offset, defined as the magnitude of the difference between the required sample rate $F_s$ and the nominal sample rate $F_{snom}$, is minimized.

The nominal sample rate $F_{snom}$ is simply a rate chosen from within the realizable range of the sampler. Typically, the rate or frequency at the center of the sampler's range would be designated as the nominal sample rate. In some bases, the nominal rate might not be the center of the frequency span. For example, the most stable frequency (characterized by the lowest drift and/or jitter) might be anywhere within the frequency span of the sampler, but would be chosen as the nominal rate because it offers the best performance, and therefore it would be desirable to keep the sampler as close to this frequency as possible.

Suppose that the sampler can be adjusted or tuned to sample at any frequency between 77.75 MHz and 77.77 MHz. The center frequency or rate is therefore 77.76 MHz. Designating the center frequency as the nominal sample rate means, therefore, that the maximum frequency offset would be plus or minus 0.01 MHz for this sampler.

One could just as easily designate 77.75 MHz as the nominal sample rate, but the allowable frequency offset would now be 0 to 0.02 MHz. The choice of the nominal sample rate is arbitrary (as long as it is within the realizable range); m and n must still be selected so that the resulting sample rate $F_s$ is within the realizable range of the sampler.

The technique of subsampling to acquire information about a repetitive signal depends upon accurate timing of the samples. The repetitive nature of the signal makes it possible to construct a time history of the signal while sampling at a fraction of the signal bandwidth, but does not relax the need for temporal precision of the samples. Commonly, a pulsed laser is employed to optically sample a repetitive signal. Such lasers exhibit very consistent pulse timing over the short-term (low jitter), while over longer periods, the pulse frequency may slowly drift due to temperature effects. Another characteristic of pulsed lasers is that their pulse rates are tunable only over a narrow range, because the pulse rate is a function of the optical geometry, and the optical geometry is difficult to alter without disturbing other geometric relationships crucial to the laser's operation. This characteristic limits the applicability of conventional subsampling to signals of certain pattern lengths and data rates, and constrains the selection of parameters m and n for the case of decimating subsampling.

Given the pattern length N and desired equivalent resolution $\Delta F_b$, the sample rate $F_s$ is completely determined by the choice of decimation ratio n and pattern repetition factor m. The process for selecting n and m with consideration of the frequency offset will now be described.

$$F_s = n F_b/(mN + \Delta F_b) \qquad (1)$$

Since $\Delta F_b$ (the equivalent resolution in bits) is generally much less than one, and m and N are positive integers, it follows $$\Delta F_b << mN \qquad (2)$$

and $$mN/n \approx F_b/F_s \qquad (3)$$

Then $$m/n \approx (F_b/F_s)/N \qquad (4)$$

If a particular decimation ratio n is desired, we have $$m \approx n \, (F_b/F_s)/N \qquad (5)$$

The application of the technique can be seen from this expression. Given the data rate $F_b$ and the pattern length N, use the nominal sample rate $F_{snom}$ along with the desired decimation ratio n in the above expression to obtain m. Then compute the actual sample frequency from expression (1) and round to the nearest integer.

In general, the larger the decimation factor n, the more sensitive the equivalent resolution is to changes or uncertainty in sample frequency $F_s$. The larger the decimation ratio, the greater the number of pattern repetitions that will elapse between decimated samples. Thus uncertainty in the sample frequency results in uncertainty in the equivalent resolution that is proportional to decimation ratio n. Consequently, it is desirable to choose the smallest decimation ratio that results in an acceptably small frequency offset, in order to reduce the effects of sample frequency drift on equivalent resolution. This is illustrated by the data of Table 1.

TABLE 1

PRBS for $F_b$ = 39.81312 GHz at 0.01 bit resolution, $F_{snom}$ = 77.76 MHz

| Pattern Length | Decimation Ratio n | Patterns per Sample m | Sample Frequence $F_S$ | % Change in res per Hz $F_S$ |
|---|---|---|---|---|
| $2^4-1 = $ 15 | 30 | 1024 | 77759949.4 | −1.98% |
|  | 16 | 546 | 77778894.0 | −1.05 |
|  | 15 | 512 | 77759898.8 | −0.988 |
|  | 10 | 341 | 77835859.6 | −0.657 |
|  | 8 | 273 | 77778799.1 | −0.526 |
|  | 6 | 205 | 77683884.0 | −0.396 |
| $2^5-1 = $ 31 | 32 | 529 | 77688826.3 | −2.11 |
|  | 31 | 512 | 77759951.0 | −2.04 |
|  | 30 | 495 | 77835961.0 | −1.97 |
|  | 20 | 330 | 77835935.6 | −1.31 |
|  | 16 | 264 | 77835916.6 | −1.05 |
|  | 10 | 165 | 77835859.6 | −0.657 |
|  | 8 | 132 | 77835821.5 | −0.526 |
| $2^7-1 = $ 127 | 127 | 512 | 77759988.0 | −8.36 |
|  | 64 | 258 | 77764722.7 | −4.21 |
|  | 32 | 129 | 77764698.9 | −2.11 |
|  | 30 | 121 | 77724528.1 | −1.98 |
|  | 20 | 81 | 77404649.2 | −1.33 |
|  | 10 | 40 | 78372129.2 | −0.648 |
| $2^{10}-1 = $ 1023 | 1023 | 512 | 77759998.5 | −67.4 |
|  | 512 | 256 | 77836008.8 | −33.6 |
|  | 256 | 128 | 77836005.8 | −16.8 |
|  | 128 | 64 | 77835999.8 | −8.41 |
|  | 64 | 32 | 77835988.0 | −4.21 |
|  | 32 | 16 | 77835964.2 | −2.10 |
|  | 20 | 10 | 77835935.6 | −1.31 |
|  | 16 | 8 | 77835916.6 | −1.05 |
|  | 10 | 5 | 77835859.6 | −0.657 |
|  | 8 | 4 | 77835821.5 | −0.526 |
| $2^{15}-1 = $ 32767 | 64 | 1 | 77762349.4 | −4.21 |

One method for choosing m and n will be demonstrated by example. Assume the following parameter values:

$F_b = 64 * 622.08$ MHz $= 39.81312$ GHz $F_{snom} = 77.76$ MHz

From (2) above, $m/n \cong (F_b/F_s)/N$

Since $F_b/F_{snom} = 38.81312$ GHz/77.76 MHz $= 512$, the closer (m/n) is to (512/N), the closer $F_s$ will be to $F_{snom}$. Therefore, if the objective is to minimize the frequency offset $(F_s - F_{snom})$, initial values for m and n can be found:

$m = F_b/F_{snom}$ $n = N$ (6)

If N is relatively small, e.g. 15 or 31, then n=N is an acceptable decimation factor, since the equivalent resolution will be relatively insensitive to changes in sample frequency. It can be shown that the partial derivative of the equivalent time resolution Δ with respect to the sample frequency $F_s$ is proportional to the decimation factor n. Thus, as the decimation factor n is increased, Δ becomes more sensitive to variations in $F_s$. Since no frequency source is perfectly stable, there will always be some variation in $F_s$. The result is that the equivalent time resolution changes from sample to sample as the sample frequency fluctuates. It is therefore necessary to limit the decimation factor n to a value that ensures an acceptably small variation in Δ, given the stability of the sample frequency $F_s$.

If, on the other hand, N is not relatively small, then n=N is not an acceptable decimation factor. Using n=N would result in excessive sensitivity to variations in the sample rate, so alternate values for m and n must be found. In this case, alternate values for m and n above can be found by dividing the initial values by the same number and rounding to the nearest integer. The frequency offset is kept relatively small when $m/n = (F_b/F_{snom})/N$, and this condition is maintained when the initial values for m and n are be reduced by a common factor.

Commonly, the pattern length N is one less than a power of two, i.e. $N = 2^k - 1$. For example, if $F_b/F_{snom} = 512$ and N=1023, initial values for m and n are 512 and 1023, respectively. Such a large decimation factor is undesirable because of excessive sensitivity to sample frequency drift. However, since 1023 is very close to a power of two $(1024 = 2^{10})$, and m is initially exactly $512 = 2^9$, dividing initial values for m and n by a power of two will ensure that m/n remains close to 512/N. Therefore the frequency offset will be kept small. Alternate values for m and n, with N=1023 would include:

m, n=512, 1023 (Initial values)

m, n=512, 1024 (Powers of two approximation to initial values)

m, n=256, 512 (After division by two)

m, n=128, 256 m, n=64, 128 m, n=32, 64 m, n=16, 32

From equation (2), it is seen that choosing m and n such that the quotient m/n is close in value to $(F_b/F_{snom})/N$ will result in a sample frequency $F_s$ that is close to $F_{snom}$. Therefore, the required tuning range of $F_s$ is kept small by choosing m and n according to this relation.

A common test signal is the pseudo-random binary sequence (PRBS), which is a special type of repetitive signal with a pattern length $N = 2^k - 1$ bits, where k is a positive integer. Typical PRBS lengths vary from 15 to $2^{31} - 1$. If $F_b/F_{snom}$ is a factor of two, and N is closely approximated by a power of 2, as in the example above, then the initial choices for m and n can be reduced by like powers of two. This provides the flexibility to gain insensitivity to frequency drift by reducing the decimation ratio n while retaining a relatively small frequency offset.

When both m and n are divided by a common number, the sample frequency $F_s$ and the sensitivity to frequency drift changes only very slightly.

One is not constrained to reducing m and n by factors of like powers of two, either, or even like factors. Any positive m and n can be chosen; the consequence is that as m/n diverges from $(F_s/F_{snom})/N$, the frequency offset also grows. If N is relatively large, and $F_b/F_{snom}$ is also relatively large, there is considerable freedom in reducing m and n from initial values while avoiding an excessively large frequency offset.

As discussed above, the decimation factor can be selected independently from the effective resolution. The decimation factor can be traded-off against the required tuning range of the sample frequency. If the decimation factor is too small for optimal sensor performance, simply increase m and n by the same (integer) factor.

The adjustability of $F_s$, combined with the selection of m and n allows freedom in the effective resolution. This follows from the governing equation. Thus, there is certainly a drawback to increasing a decimation factor and that is that the measurement takes longer to acquire the same number of points. This then becomes a trade-off.

If the decimation factor is too small for optimal sensor performance, m and n may be increased by the same integer factor. The sensor may not actually work well passing every sample or even every decimated sample. Sensor performance can be improved by reducing its measurement duty cycle by increasing the decimation factor, thereby providing the sensor with fewer samples per time. That can be done by changing m and n by the same number and keeping $\Delta$ at the selected resolution.

Trigger 108 (FIG. 1) is a distinctive signal that is used to trigger or actuate the beginning of a measurement. This is typically used with an oscilloscope, such as oscilloscope 101, which is a device that takes the measurement of the signal and constructs a figure on a CRT. The pattern trigger is a signal that occurs once per repetition of the entire pattern. It would have 1/N times the frequency of the actual data stream if it is a binary signal. The pattern trigger then can be used with an ordinary oscilloscope to make a measurement using the repetitive subsampling technique described above. Normally the pattern trigger occurs once per pattern, so each time the pattern has elapsed there will be a pattern trigger.

In the embodiment discussed above, the pattern trigger is decimated as well as the repetitive signal. In the case if the oscilloscope, then the pattern trigger would be decimated by an integer factor. That decimation means that a number of triggers are skipped and then one is accepted, then a number of triggers are again skipped and then one accepted, and so on. The pattern trigger could be derived from a clock at a rate of $F_b/N$. This would be $n_{trig}$ as shown in circuit 106, FIG. 1.

Effectively what happens is that over the period of time that elapses between decimated triggers, there is a complete sample sequence. From the start of the measurement, $n_{trig}$ pattern triggers have elapsed. All the data points have been collected which are necessary to get the effective resolution specified by the formula. This is the period of a complete measurement.

If the pattern trigger is decimated appropriately, the decimated samples can be directly observed on an ordinary oscilloscope. The pattern decimation factor can be derived as follows:

For decimation ratio n, the number of bits elapsed for each decimated sample is $$F_b/(F_s/n) = nF_b/F_s \quad (40)$$

and the number of decimated samples required for complete pattern coverage is $N/(\Delta F_b)$. The total number of bits elapsed for complete pattern coverage is $$nF_b/F_s * N/(\Delta F_b) = n/F_s * F_b N/(\Delta F_b)$$

And the number of patterns elapsed is the number of bits elapsed divided by N:

$$n/F_s * F_b/(\Delta F_b)$$

Substituting for $n/F_s$ from the expression in the summary of the technique:

$$n/F_s * F_b/(\Delta F_b) = (mN/F_b + \Delta)*F_b/(\Delta F_b) = mN/(\Delta F_b)+1$$

Therefore the decimation factor for the pattern trigger is $$n_{trig} = mN/(\Delta F_b)+1 \quad (7)$$

It is not necessary to have a trigger if the sampling system has adequate memory, because then the system could simply record a number of samples and then extract the desired number of periods of the signal from the sample memory.

The actual generation (origin) of the pattern trigger itself is not shown, but it could be an output of the equipment that actually generates the bit stream, or it could be derived from a clock data recovery circuit that operates on the data.

The feasibility of decimating sampling can be estimated by examining the percentage change in equivalent resolution that results from a one Hertz change to $F_s$. If the equivalent resolution is relatively insensitive to changes to $F_s$, the measurement is feasible.

The sensitivity of the resolution to variations in sample frequency is proportional to the decimation ratio. In other words, the smaller the decimation ratio, the better the precision of sample timing. The result is intuitive; the smaller the decimation ratio, the less time elapsed between actual (decimated) samples. As the decimation ratio is increased, the required tuning range for the sample frequency generally decreases, because m/n can be made closer to $(F_b/F_{snom})/N$.

Sample Calculations: Application to PRBS Patterns

Following are some sample calculations for PRBS patterns.

In general, $$F_s = nF_b/(mN+\Delta F_b) \approx m/n$$

$$(F_b/F_s)/N \approx m/n$$

The closer m/n is to $(F_s/F_b)/N$, the smaller the required change from the nominal sample rate. For this reason, making $(F_s/F_b)$ equal to a power of two is advantageous for subsampling PRBS patterns.

EXAMPLE 1

$N=15=2^4-1$ $m=n(F_b/F_s)/N=n*512/15$

For $n=15, n(F_b/F_s)/N=512 \rightarrow$ choose $m=512$ $F_s=n\ F_b/(mN+\Delta F_b)=15*64*622080000/(512*15+0.01)=77,759,898.8$ Hz Alternatively, increase the decimation factor to $30 \rightarrow m=1024$ $F_s=30*64*622080000/(1024*15+0.01)=77,759,949.4$ Hz

EXAMPLE 2

$N=31=2^5-1$ $m \approx n(F_b/F_s)/N=n*512/31$

For $n=31, n(F_b/F_s)/N=512 \rightarrow$ choose $m=512$ $F_s=n\ F_b/(mN+\Delta F_b)=31*64*622080000/(512*31+0.01)=77,759,951$ Hz

EXAMPLE 3

$N=63=2^6-1$ $m \approx n(F_b/F_s)/N=n*512/63$

For $n=63, n(F_b/F_s)/N=512 \rightarrow$ choose $m=512$ $F_s=n\ F_b/(mN+\Delta F_b)=31*64*622080000/(512*31 +0.01)=77,759,975.9$ Hz Alternatively, reduce the decimation factor to $n=32$ For $n=32, n(F_b/F_s)/N=260 \rightarrow$ choose $m=260$ $F_s=32*64*622080000/(260*63 +0.01)=77,778,941.5$ Hz

EXAMPLE 4

$N=127=2^7-1$ $m \approx n(F_b/F_s)/N = n*512/127$

For $n=127$, choose $m=512$ $F_s = n\, F_b/(mN+\Delta F_b) = 127*64*622080000/(512*127+0.01) = 77,759,988$ Hz Alternatively, reduce the decimation factor to $n=32 \rightarrow$ choose $m=129$ $F_s = 32*64*622080000/(129*127+0.01) = 77,764,698.9$ Hz

EXAMPLE 5

$N=1023=2^{10}-1$ $m-n(F_b/F_s)/N = n*512/1023$

For $n=1023$, choose $m=512$ $F_s = n\, F_b/(mN+\Delta F_b) = 1023*64*622080000/(512*1023 +0.01) = 77,759,998.5$ Hz Alternatively, choose $n=20$, and $m=10$ $F_s = n\, F_b/(mN+\Delta F_b) = 20*64*622080000/(10*1023+0.01) = 77,835,935.6$ Hz

EXAMPLE 6

$N=2^{15}-1=32767$ $m \approx n(F_b/F_s)/N = n*512/32767$

For $n=64$, $n(F_b/F_s)/N = 1 \rightarrow$ choose $m=1$ $F_s = n\, F_b/mN+\Delta F_b) = 64*64*622080000/(1*32767+0.01) = 77,762,349.4$ Hz Application to Some Short Patterns

EXAMPLE 7

$N=8$ $m \approx n(F_b/F_s)/N = n*512/8 = n*64$

For $n=1$, $n(F_b/F_s)/N = 512 \rightarrow$ choose $m=64$ $F_s = n\, F_b/(mN+\Delta F_b) = 1*64*622080000/(64*8+0.01) = 77,758,481.3$ Hz Alternatively, choose $n=20$; $m=20*64=1280$ $F_s = 20*64*622080000/(1280*8+0.01) = 77,759,924.1$ Hz

EXAMPLE 8

$N=9$ $m \approx n(F_b/F_s)/N = n*512/9$

For $n=9$, $n(F_b/F_s)/N = 512 \rightarrow$ choose $m=512$ $F_s = n\, F_b/(mN+\Delta F_b) = 9*64*622080000/(512*9+0.01) = 77,759,831.3$ Hz Alternatively, choose $n=18 \rightarrow$ choose $m=1024$ $F_s = n\, F_b/(mN+\Delta F_b) = 18*64*622080000/(1024*9+0.01) = 77,759,915.6$ Hz

EXAMPLE 9

$N=10$ $m \approx n(F_b/F_s)/N = n*512/10$

Figure 2:
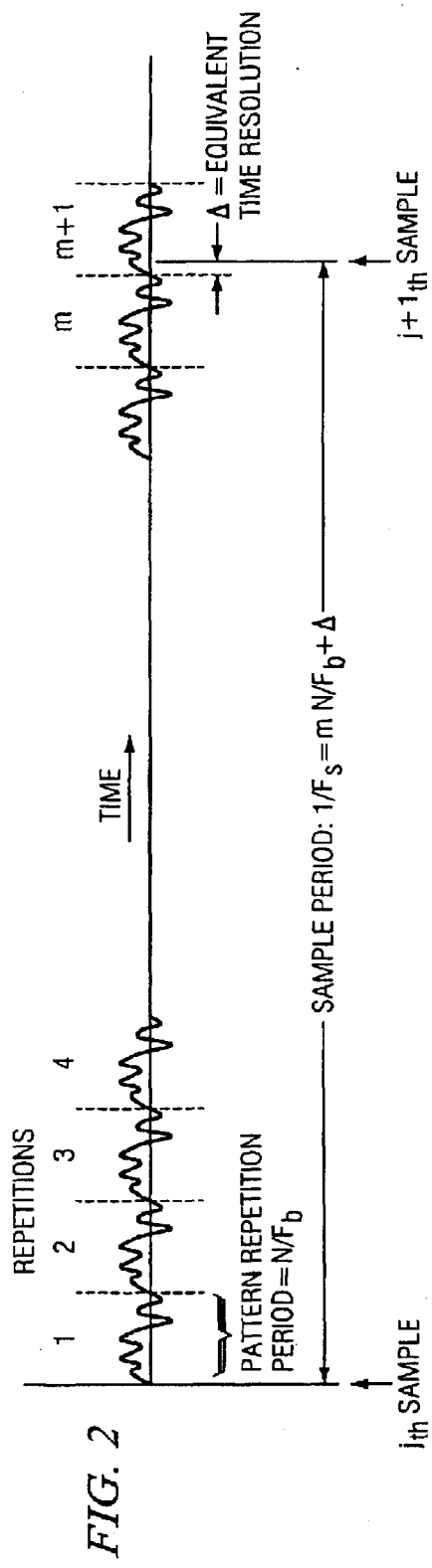
FIG. 2 shows a conventional graph of subsampling.

For $n=10$, $n(F_b/F_s)/N = 512 \rightarrow$ choose $m=512$ $F_s = n\, F_b/(mN+\Delta F_b) = 10*64*G22080000/(512*10+0.01) = 77,759,848.1$ Hz Alternatively, choose $n=20 \rightarrow$ choose $m=1024$ $F_s = nF_b/(mN+\Delta F_b) = 20*64*622080000/(1024*10+0.01) = 77,759,924.1$ Hz FIG. 2 shows a conventional plot of subsampling. The sample rate is chosen such that each sample follows the previous sample by some integer number m of signal repetitions plus some time increment Δ. If the time increment Δ is small compared with the period of signal repetition, then the sequence of samples will be a time history of the signal with an equivalent time resolution equal to Δ.

Figure 3:
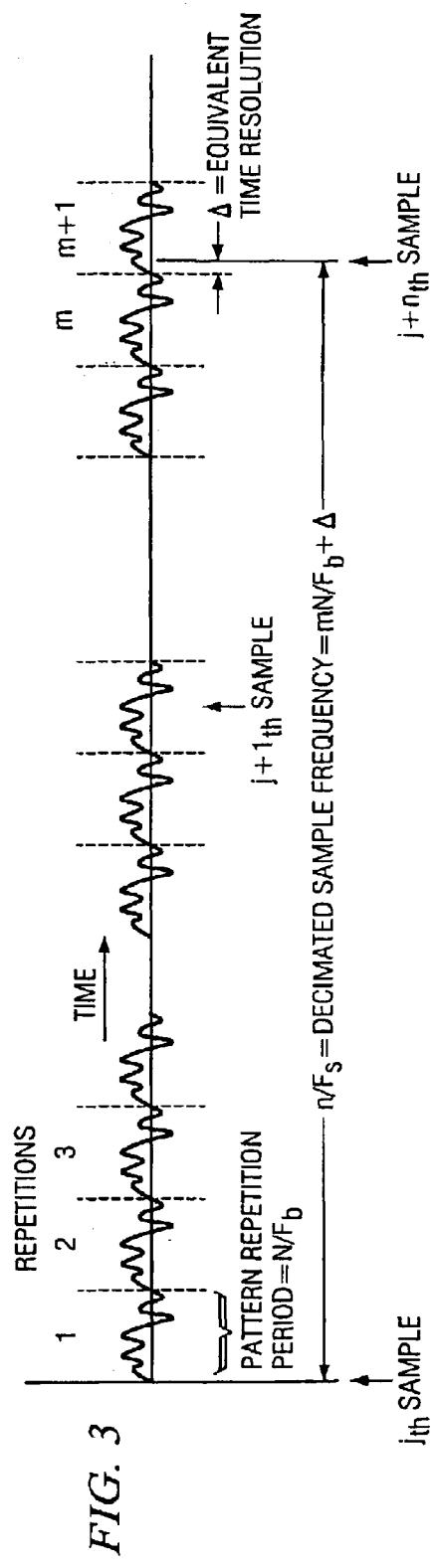
FIG. 3 shows a graph of improved subsampling using the concepts of the invention.

FIG. 3 shows an improved plot of subsampling after the application of the concepts taught herein. The sample rate is chosen such that the time interval over which n samples are taken is equal to the time elapsed for some integer number m of signal repetitions plus some time increment Δ. If the time increment Δ is small compared with the period of signal repetition, then the sequence of samples formed by every $n^{th}$ sample will be a time history of the signal with an equivalent time resolution equal to Δ.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. The method of sampling a repetitive signal having a data rate $F_b$ comprising:

selecting a sample frequency $F_s$, where $1/F_s$ is the time elapsed between samples (sec);

selecting decimation parameter n so that after some number of samples n, the equivalent sample point has advanced by exactly Δ seconds; and decimating said repetitive signal by said decimation parameter n, where the time elapsed during n samples $(n/F_s)$ is constrained to be equal to the time elapsed during m repetitions of the signal, plus Δ seconds, where m is the pattern repetitions between decimated samples.

2. The method of claim 1 where parameters m and n are positive integers and wherein $m/n \cong (F_b/F_s)/N$, where N is the pattern length of said signal.

3. The method of claim 2 wherein when $N=2^k-1$ bits, where k is a positive integer, the values for m and n are:

$m=F_b/F_{snom}$ rounded to the nearest integer, divided by a particular power of 2; and n=N divided by said particular power of 2, where N is the pattern length of said repetitive signal.

4. The method of claim 3 wherein initial values for m and n are:

$m=F_b/F_{snom}$ rounded to the nearest integer and n=N, where $F_{snom}$ is the nominal sample rate and N is the pattern length.

5. The method of claim 3 wherein when N is not relatively small, the values for m and n are:

$m=F_b/F_{snom}$ rounded to the nearest integer, divided by a power of 2, rounded to the nearest integer; and n=N divided by a power of 2, rounded to the nearest integer, where $\Delta$ is the equivalent time resolution.

6. The method of claim 3 wherein said dividing number is selected such that m/n is close in value to $(F_b/F_{snom})/N$.

7. The method of claim 5 wherein the dividing number which is used is not the same for m and n.

8. A system for displaying a repetitive signal on a display, said signal having any repetition rate, including repetition rates which require storing and reordering prior to presentation to said display, said system comprising:

means for establishing a signal sampling clock rate;

means for sampling said repetitive signal under control of said clock rate; and means for decimating said sampled repetitive signal to achieve, without storage, a correctly ordered sample sequence for presentation to said display.

9. The system of claim 8 further comprising means for presenting said correctly ordered sample sequence to an input of said display.

10. The system of claim 9 wherein said display includes a trigger input and means for presenting a pattern trigger signal to said trigger input.

11. The system of claim 10 further comprising means for decimating said pattern trigger signal prior to said signal being applied to said trigger input.

12. The system of claim 10 wherein said decimating of said repetitive signal is by a factor of n and wherein said decimating of said pattern trigger signal is by a factor of $n_{trig}$, where $n_{trig}=mN/(\Delta F_b)+1$, and where N=pattern length (bits)

$F_b$=data rate (Hz)

$\Delta$=equivalent time resolution (sec); and m=pattern repetitions between decimated samples.

13. The system of claim 12 wherein $m \cong n (F_b/F_s)/N$, where $F_s$=sample frequency (Hz).

14. The system of claim 12 wherein when N is not relatively small the values for m and n are:

$m=F_b/F_{snom}$, rounded to the nearest integer, divided by a power of 2, rounded to the nearest integer; and n=N divided by a power of 2, rounded to the nearest integer.

15. The system of claim 14 wherein said dividing factors are selected such that m/n is close in value to $(F_b/F_{snom})/N$.

16. The system of claim 14 wherein said powers of 2 which are used are not the same for m and n.

17. A method for displaying a repetitive signal on a display, said signal having any repetition rate, including repetition rates which require storing and reordering prior to presentation to said display, said method comprising the steps of:

establishing a signal sampling clock rule;

sampling said repetitive signal under control of said clock rule;

decimating said sampled repetitive signal to achieve, without storage, a correctly ordered sample sequence for presentation to said display; and presenting said correctly ordered sample sequence to an input of said display.

18. The method of claim 17 wherein said display includes a trigger input and said method includes the step of presenting a pattern trigger signal to said trigger input.

19. The method of claim 18 further comprising the step of documenting said pattern trigger signal prior to said signal being applied to said trigger input.

20. The method of claim 18 wherein said decimating of said repetitive signal is by a factor of n and wherein said decimating of said pattern trigger signal is by a factor of $n_{trig}$, where $n_{trig}=mN/(\Delta F_b)+1$, and where N=pattern length (bits)

$F_b$=data rate (Hz)

$\Delta$=equivalent time resolution (sec); and m=pattern repetitions between decimated samples.

* * * * *